(12) United States Patent  
Godfrey (10) Patent No.: US 10,775,425 B2  
(45) Date of Patent: Sep. 15, 2020

(54) MONITORING OF POWER CABLES WITH DISTRIBUTED FIBRE OPTIC SENSING

(71) Applicant: OPTASENSE HOLDINGS LIMITED, Farnborough, Hampshire (GB)

(72) Inventor: Alastair Godfrey, Farnborough (GB)

(73) Assignee: OPTASENSE HOLDINGS LIMITED, Hampshire (GB)

( * ) Notice: Subject to any disclaimer, the term of this patent is extended or adjusted under 35 U.S.C. 154(b) by 0 days.

(21) Appl. No.: 15/738,849

(22) PCT Filed: Jun. 23, 2016

(86) PCT No.: PCT/GB2016/051889  
§ 371 (c)(1),  
(2) Date: Dec. 21, 2017

(87) PCT Pub. No.: WO2017/001826  
PCT Pub. Date: Jan. 5, 2017

(65) Prior Publication Data  
US 2018/0180658 A1 Jun. 28, 2018

(30) Foreign Application Priority Data  
Jun. 29, 2015 (GB) .................................. 1511373.1

(51) Int. Cl.  
*G01B 7/14* (2006.01)  
*G01B 7/30* (2006.01)  
(Continued)

(52) U.S. Cl.  
CPC ............. *G01R 31/083* (2013.01); *G01D 5/12* (2013.01); *G01D 5/14* (2013.01); *G01D 5/145* (2013.01);  
(Continued)

(58) Field of Classification Search  
CPC .......... G01D 5/145; G01D 5/14; G01D 5/147; G01D 5/12; G01B 7/003; G01B 7/14;  
(Continued)

(56) References Cited

U.S. PATENT DOCUMENTS 6,237,421 B1 5/2001 Li et al.  
7,154,081 B1 12/2006 Friedersdorf et al.  
(Continued)

FOREIGN PATENT DOCUMENTS

GB 2442745 4/2008  
GB 2503498 1/2014  
(Continued)

OTHER PUBLICATIONS

Masoudi et al., "Distributed optical fiber dynamic magnetic field sensor based on magnetostriction", Applied Optics, Optical Society of America, vol. 53, No. 13, May 1, 2014, p. 2833-2838.

*Primary Examiner* — Raul J Rios Russo  
(74) *Attorney, Agent, or Firm* — McDonnell Boehnen Hulbert & Berghoff LLP (57) ABSTRACT

This application relates to methods and apparatus for monitoring power cables (100) carrying multiple AC phases to detect deformation of the power cable. A distributed fibre optic interrogator unit (302) is used to interrogate a sensing optical fibre (301) coupled to the power cable to provide a measurement signal from each of a plurality of longitudinal sensing portions of the sensing optical fibre. An analyser (602) is configured to analyse the measurements signals to detect a characteristic of an imbalance in magnetic fields. The characteristic may be a signal component with a characteristic frequency related to the power frequency and number of AC phases, the sensing optical fibre may be sensitised to magnetic fields and the characteristic frequency may be 2n times the power frequency where n is the number (Continued)

of phases, e.g. six times the power frequency for three phase AC.

18 Claims, 2 Drawing Sheets

(51) Int. Cl.
*G01R 33/02* (2006.01)
*G01R 31/08* (2020.01)
*G01R 33/032* (2006.01)
*G01L 1/24* (2006.01)
*G01D 5/56* (2006.01)
*G01D 5/353* (2006.01)
*G01R 31/58* (2020.01)
*G01D 5/14* (2006.01)
*G01D 5/12* (2006.01)
*G01R 33/04* (2006.01)
*G01R 33/07* (2006.01)
*G02B 6/44* (2006.01)
*H02G 9/02* (2006.01)
*G01B 7/00* (2006.01)
*G02B 6/50* (2006.01)

(52) U.S. Cl.
CPC ............ *G01D 5/147* (2013.01); *G01D 5/353* (2013.01); *G01D 5/35338* (2013.01); *G01D 5/56* (2013.01); *G01L 1/242* (2013.01); *G01R 31/081* (2013.01); *G01R 31/58* (2020.01); *G01R 33/02* (2013.01); *G01R 33/0327* (2013.01); *G01R 33/04* (2013.01); *G01R 33/072* (2013.01); *G02B 6/4416* (2013.01); *G01B 7/003* (2013.01); *G01B 7/14* (2013.01); *G01B 7/30* (2013.01); *G02B 6/506* (2013.01); *H02G 9/02* (2013.01)

(58) Field of Classification Search
CPC .......... G01B 7/30; G01R 33/07; G01R 33/02; G01R 33/072
USPC .................... 324/51, 55, 200, 207.11, 207.13
See application file for complete search history.

(56) References Cited

U.S. PATENT DOCUMENTS

| | | | |
|---|---|---|---|
| 2010/0280773 A1* | 11/2010 | Saether | G01R 31/00 702/58 |
| 2013/0154632 A1* | 6/2013 | McEwen-King | G02B 6/4401 324/244.1 |
| 2014/0049786 A1* | 2/2014 | Knuepfer | G01B 11/02 356/634 |
| 2015/0040681 A1* | 2/2015 | Sarchi | G01M 5/0025 73/847 |
| 2015/0128706 A1* | 5/2015 | Godfrey | G01H 9/004 73/574 |
| 2017/0102415 A1* | 4/2017 | Sarchi | G01R 15/246 |
| 2017/0292862 A1* | 10/2017 | Godfrey | G01D 5/3538 |
| 2018/0045768 A1* | 2/2018 | Godfrey | G01R 31/083 |
| 2018/0113037 A1* | 4/2018 | Molteni | G01D 5/35361 |

FOREIGN PATENT DOCUMENTS

| | | |
|---|---|---|
| WO | WO 2012/028846 | 3/2012 |
| WO | WO 2012/137021 | 10/2012 |
| WO | WO 2012/137022 | 10/2012 |
| WO | WO 2015/144199 | 10/2015 |

\* cited by examiner

MONITORING OF POWER CABLES WITH DISTRIBUTED FIBRE OPTIC SENSING

FIELD OF THE INVENTION

This application relates to methods and apparatus for monitoring of power cables, for instance for detecting deformation of power cables, and in particular to detecting the occurrence and/or location of defects in power cables and/or bending of the power cable.

BACKGROUND OF THE INVENTION

For power transmission over distance it is usual to transmit power over transmission lines at high voltage to reduce power losses. Typically power is transferred using high voltage AC power transmission. Three phase AC transmission is the most common, although for supplying some remote areas fewer phases may be used.

On land, outside of urban areas, it is typical to transmit power using high voltage AC power distribution using overhead transmission lines. The various conducting lines are suspended so as to be sufficiently far above the ground and away from one another to provide electrical isolation, i.e. the surrounding air acts as an insulator.

In some instances however such overhead lines may not be practical or appropriate. For instance in urban environments it may be desired to transmit and distribute power using buried cables rather than overhead lines. For transmission of power across bodies of water it may also be better to use submarine power cables. This is becoming increasingly of interest with the growing popularity of offshore power generation, e.g. offshore wind farms and the like.

Figure 1:
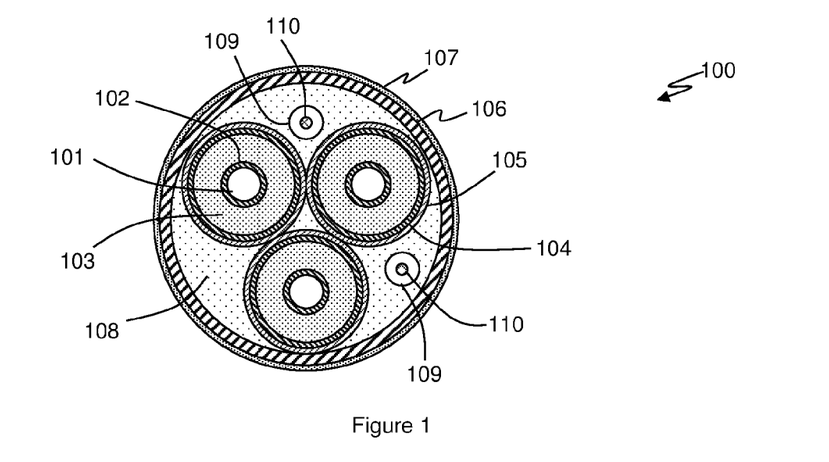
FIG. 1 illustrates a cross-section of an example of a known type of power cable.

In a power distribution cable it is necessary to insulate the conductors that are used for power transfer from one another and also from the environment. FIG. 1 illustrates the general principles of such power cables and shows a cross-section of one example of a power cable 100 such as may be used, for example, for medium or high voltage AC power transmission, i.e. voltages of tens or possible hundreds of kilovolts.

FIG. 1 illustrates that the cable may have three conductors 101, one for each AC phase, each of which may, for example, be formed from copper or a similar material. The conductors are each sheathed by at least one semi-conductive layer 102 which is surrounded by a respective insulator 103 such as XLPE (cross-linked polyethylene). Each insulator 103 may be surrounded by one or more sheathing layers 104 and 105, which may, for example, include at least one semi-conductive sheathing layer 104. For a high voltage cable, layer 105 could be a lead sheath for example whereas for a medium voltage application layer the layer 105 may be a copper screen. It will be understood by one skilled in the art there may be additional or alternative sheathing layers such as semi-conductive polyethylene, aluminium tape, a conductive counter-helix or the like and/or other layers such as swelling tape surrounding the insulator. The sheathing layers, i.e. 102, 104 and/or 105, are arranged to provide electric shielding to shield the other conductors and the environment from any electric field generated by the current flowing in the conductors in use.

The three conductors, with their associated sheathing and insulation layers, are all contained within an armour layer 106 which may for instance comprise a braiding of galvanised steel wires to provide protection for the power cable. The power cable may also have an outer jacket layer 107 such as a polypropylene yarn cladding.

There may be filler material 108 within the cable, which may comprise a plurality of elongate filler elements disposed inward of the armour layer 106. This can give the overall power cable a desired form and ensure the sheathed conductors are held in place within the power cable, as well as providing additional padding/protection.

Additionally it is common to embed at least one optical fibre within the cable, or at least provide the ability for optical fibres to be located within the power cable, for instance to allow for data communication between the various power stations linked by the cable. Thus there may be at least one fibre optic conduit 109 for carrying one or more optical fibres 110, and typically a bundle of optical fibres.

Figure 2:
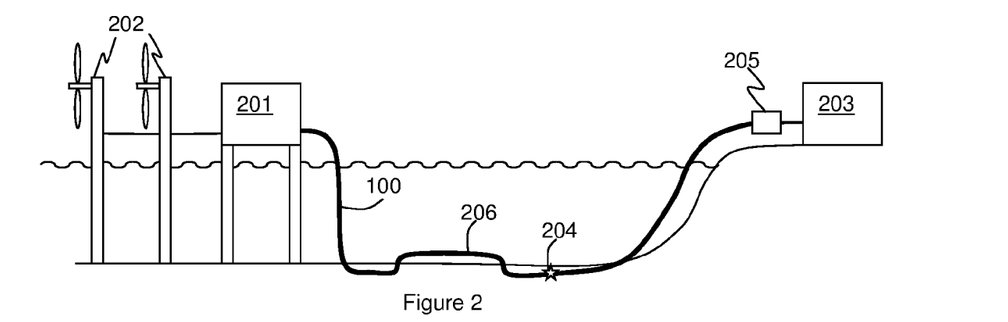
FIG. 2 illustrates a power cable for power transmission experiencing a fault.

As mentioned one particular area of application for such power cables is for carrying power across bodies of water, e.g. from an offshore power generation site, such as a wind farm, as illustrated in FIG. 2. FIG. 2 illustrates that a first power station 201, which in this example may be located on an off shore platform, may be connected to a local source of power, such as a plurality of wind turbines 202. The first power station 201 may receive electrical power from the wind turbines and in some instances transform the voltage to a high voltage for transmission to an on-shore power station 203 via power cable 100. Power cable 100 may be deployed to run along the sea-bed to shore. In examples such as this wind farm example the first power station 201 may be several kilometres or several tens of kilometres from shore.

In use the conductors of the power cable 100 may carry very high voltages, of the order of hundreds of kilovolts for example. Thus good quality insulation is required and it is important that the cable is substantially defect free.

Submarine power cables may in some instances be damaged or become highly distorted during the deployment or during subsequent use. If a cable is damaged or highly distorted this may degrade the insulation and, in use with the operating voltage applied to the cable, the insulation may fail such that there is a discharge between conductors of the cable, or between a conductor and the environment, i.e. earth. This can result in a high voltage discharge with a significant fault current, e.g. arcing. Typically such a fault may result in a catastrophic failure of the relevant part of the cable, with potentially explosive failure of the cable. FIG. 2 illustrates a cable insulation failure and catastrophic fault at location 204. This will generally result in power transmission through the cable having to be stopped until the cable can be repaired, for instance by opening one or more high voltage circuit breakers 205. It would therefore be useful to be able to check a cable for any defects after installation or any downtime prior to re-energising the cable and/or detect the location of a fault when it occurs.

In use it would also be desirable to be able to detect significant movement of the power cable, for instance resulting from vortex induced vibration of the cable or free-spanning of the power cable. Free-spanning refers to a submarine cable floating freely. Many submarine cables are buried in the sediment on the sea bed to prevent movement of the cable and provide protection. Over time however sections of the power cable may become exposed, and thus more prone to damage. FIG. 2 for example illustrates that the cable may be largely buried but a section 206 may be exposed and free spanning. Movement of an exposed cable can also lead to scour effects. Vortex induced vibration (VIV) in particular is vibration induced on the cable due to the cable interacting with flow around the cable. VIV can lead to/accelerate fatigue in the power cable.

Power cables of the type described can be very expensive components and failure of a power cable can result in power distribution via the cable having to be halted. It would therefore be beneficial to be able to detect when a cable is free-spanning and/or being subjected to VIV as it may be desirable to bury or rebury the cable to prevent damage.

Embodiments of the present thus relate to methods and apparatus for monitoring of power cables.

SUMMARY OF THE INVENTION

Thus according to the present invention there is provided a method of monitoring a power cable carrying multiple AC phases to detect deformation of the power cable, the method comprising:
performing distributed fibre optic sensing on a sensing optical fibre to provide a measurement signal from each of a plurality of longitudinal sensing portions of the sensing optical fibre, the sensing optical fibre being coupled to the power cable; and
analysing said measurements signals to detect a characteristic of an imbalance in magnetic fields.

It has been recognised that the magnetic field produced, in use, by a multiple phase AC power cable depends partly on the arrangement of the conductors. In a normal deployment of the power cable the arrangement of the conductors will be partly defined by the cable design. Some power cables for instance have the conductors arranged such that magnetic fields produced in use by each conductor substantially cancel one another, i.e. the magnetic fields are balanced. If the power cable is deformed the arrangement of the conductors of the power cable is changed and the result is a change in balance of the magnetic fields. Embodiments use fibre optic distributed sensing to detect a signal indicative of the unbalanced magnetic fields. Such a signal can provide an indication of deformation of the power cable. A sensing optical fibre for distributed fibre optic sensing is thus coupled to the power cable, e.g. embedded within the power cable or attached to the exterior of the power cable.

The characteristic of an imbalance in magnetic fields may be a signal component at a characteristic frequency related to a power frequency of the AC phases.

In some embodiments the measurement signal is a signal indicative of strains acting on the power cable and the characteristic frequency is n times the power frequency, where n is the number of AC phases. A magnetic field imbalance will result in magnetically induced forces on the cable due to interaction of the conductors with the fields produced by the other conductors. This will produce a time varying strain on the power cable and hence the sensing optical fibre with a frequency at n times the power frequency, where n is the number of phases. Thus for three phase AC the characteristic frequency will be three times the power frequency.

In some embodiments the sensing optical fibre comprises a magnetically sensitised optical fibre and the measurement signal from each longitudinal sensing portion is indicative of the extent of any variations in magnetic field acting on that longitudinal sensing portion. In such embodiments the characteristic frequency may be 2n times the power frequency, where n is the number of AC phases. As will be explained in more detail later the strain induced on the sensing optical fibre that is magnetically sensitised is typically independent of field polarity. For three phase AC the characteristic frequency for a measurement signal indicative of magnetic field variations will thus be six times the power frequency.

Where the sensing optical fibre comprises a magnetically sensitised optical fibre, the sensing optical fibre may comprise an optical fibre mechanically coupled to a magnetostrictive material.

In some examples the method may comprise detecting a signal component at the characteristic frequency above a threshold level. In some instances the threshold may be established, at least partly, by looking at the signal component at the characteristic frequency of multiple sensing portions.

The method may be performed when a test signal is applied to the power cable, the test signal being a multiple phase AC signal at a voltage lower than the nominal operating voltage for the power cable. The method may comprise identifying the existence of the characteristic of an imbalance in magnetic fields in the measurement signal from a longitudinal sensing portion as a possible defect in the power cable and determining the location of the defect along the power cable from the location of the relevant sensing portion. The method may be performed with the test signal prior to energising the power cable to its nominal operating voltage.

Additionally or alternatively the method may be performed in operation of the power cable and the method may comprise detecting whether the measurement signal from a sensing portion exhibits any variation in characteristic of an imbalance in magnetic fields. The method may for instance comprise detecting any variation in any signal component at the characteristic frequency.

The method may comprise identifying any variation in the characteristic of an imbalance in magnetic fields in the measurement signal from a sensing portion as an indication that the power cable is moving at the location of the relevant sensing portion. In such case the variation in characteristic of an imbalance in magnetic fields may be analysed to determine a characteristic of the movement of the power cable.

The power cable may be deployed, at least partly, as a submarine cable.

Aspects also relate to an apparatus for monitoring a power cable carrying multiple AC phases to detect deformation of the power cable, the apparatus comprising:
a distributed fibre optic interrogator unit for interrogating a sensing optical fibre coupled to the power cable to provide a measurement signal from each of a plurality of longitudinal sensing portions of the sensing optical fibre; and
an analyser configured to analyse said measurements signals to detect a characteristic of an imbalance in magnetic fields.

The apparatus of this aspect of the invention may be implemented to perform the method of any of the variants discussed above.

In particular the characteristic of an imbalance in magnetic fields may be a signal component at a characteristic frequency related to a power frequency of the AC phases.

The measurement signal may be a signal indicative of strains acting on the power cable and the characteristic frequency is n times the power frequency, where n is the number of AC phases.

In some embodiments the sensing optical fibre comprises a magnetically sensitised optical fibre and the measurement signal from each longitudinal sensing portion is indicative of the extent of any variations in magnetic field acting on that longitudinal sensing portions. In which case the characteristic frequency may be 2n times the power frequency, where n is the number of AC phases.

In some embodiments the sensing optical fibre may comprise an optical fibre mechanically coupled to a magnetostrictive material.

In some embodiments the analyser may be configured to detect a signal component at the characteristic frequency above a threshold level.

DESCRIPTION OF THE DRAWINGS

To aid in further understanding, the invention will now be described by way of example only with reference to the accompanying drawings, of which.

DESCRIPTION OF THE INVENTION

Embodiments of the present invention relate to methods and apparatus for monitoring power cables to detect deformation of the cable. The deformation may be due to a defect in the power cable, i.e. an area of significant distortion or bending of the cable and/or a damaged section of cable. Additionally or alternatively the deformation may be due to a change in orientation of the power cable, for instance due to movement or bending of a free-spanning cable or vortex induced vibrations acting on the power cable. Embodiments relate to detecting such deformation by using fibre optic distributed sensing and looking for signals induced by the imbalance in magnetic fields produced by a deformed power cable in use.

As noted above FIG. 1 illustrates generally the structure of a typical power cable for carrying three phase AC power. Each of the three conductors 101 carries one of the AC phases. Typically for three phase AC the various electrical phases vary in phase angle from one another by 120°. The cable is usually designed such that the three phase conductors are located in the cable so as to be physically spaced at 120° from one another within the cable, in other words each conductor, say the centre of each conductor, is effectively substantially equidistant from a first point and the conductors are distributed at 120° intervals around the first point (which may or may not correspond to the centre of the power cable).

The shielding of the conductors, e.g. sheathing layers 104 and/or 105, substantially blocks any electrical fields. However the varying current in each conductor will result in each conductor contributing a magnetic field component. The physical arrangement of the conductors described above is used so as to balance the magnetic forces acting on the conductors. This also means that the magnetic fields produced by each of the conductors in use substantially cancel one another outside of the power cable, for a substantially straight cable.

If however the power cable is deformed, e.g. significantly distorted, as may the case with a damaged section of cable, the arrangement of the conductors will vary from the orientation described above and thus the magnetic fields produced by the various phases in use will no longer be balanced and thus may no longer cancel.

Thus if a three phase AC signal is applied to a such power cable and the power cable is deformed at a first location along its length, then the magnetic fields produced by the three phases at the first location will not cancel, or at least will cancel to a lesser extent than would be the case for an undistorted power cable. In effect the magnetic fields become imbalanced due to the deformation or bending of the power cable.

There are various ways that a power cable may be damaged, for instance by being subject to significant external forces. The power cable could be damaged by mishandling during installation or could be damaged for instance by the action of tidal scour or anchor drag. Forces applied to the power cable could change the internal structure, and thus alter the spatial relationship of the conductors, as well as adversely affecting the insulation. A power cable may become kinked, i.e. highly bent, in a given location, for instance during installation. Such a highly distorted section of cable may be indicative of mishandling of the power cable during installation and a point of possible future failure. It may be desirable to identify any points of the cable that are highly distorted for liability purposes should the cable subsequently fail at that location.

Embodiments of the invention thus use distributed fibre optic sensing, and in particular distributed fibre optic sensing based on coherent Rayleigh backscatter, to detect a signal that is indicative of imbalanced magnetic fields and thus of deformation of the power cable.

Distributed fibre optic sensing is a known technique where an optical fibre is deployed as a sensing fibre and interrogated with optical radiation. Backscatter from within the optical fibre in response to the interrogating radiation is detected and analysed to determine environmental stimuli acting on the fibre. By an appropriate choice of interrogating radiation and analysis the sensing fibre can be effectively divided into a plurality of discrete longitudinal portions.

One particular form of such sensor used in embodiments of the invention uses coherent interrogating radiation and detects any such radiation which undergoes Rayleigh scattering from within the fibre due to the scattering sites inherent in the optical fibre. The backscatter can be analysed to determine any dynamic strains acting on the optical fibre resulting from environmental stimuli acting on the fibre. Such sensing, when used to detect dynamic strains resulting from incident pressure waves or other mechanical vibration of the fibre, may be referred to as distributed acoustic sensing (DAS). Embodiments of the present invention may thus use the principles of coherent Rayleigh scatting based DAS. In some embodiments a standard DAS sensor may be used but in some embodiments, as will be described in more detail below, the sensor may interrogate an optical fibre that has been designed to be sensitive to magnetic field variations.

Figure 3:
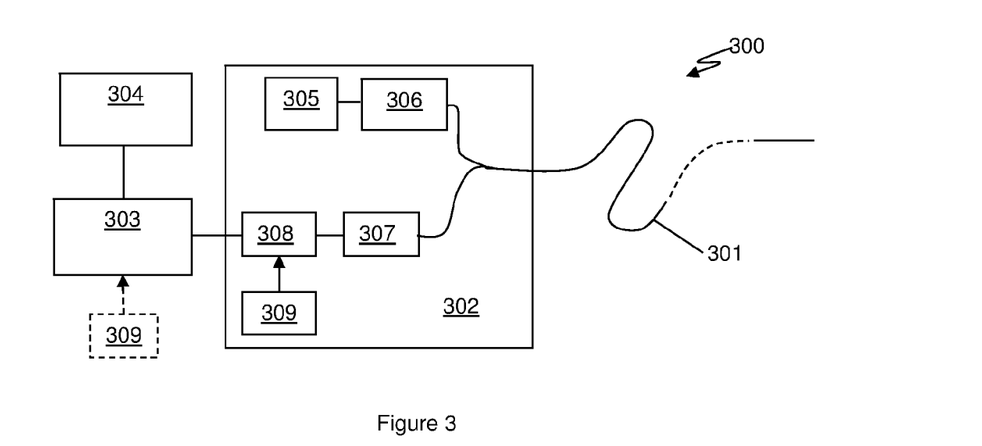
FIG. 3 illustrates a Rayleigh backscatter distributed fibre optic sensor.

FIG. 3 illustrates the principles of such a distributed fibre optic sensor 300. A length of sensing optical fibre 301 is removably connected at one end to an interrogator 302. The output from interrogator 302 is, in some embodiments, passed to a signal processor 303, which may be co-located with or integrated into the interrogator or may be remote therefrom. Optionally there may also be a user interface/graphical display 304, which may be may be co-located with the signal processor or may be remote therefrom and in practice may be realised by an appropriately specified PC. The sensing fibre 301 can be many kilometres in length and can be, for instance be up to 40 km or more in length.

The sensing fibre may be a standard, unmodified single mode optic fibre such as is routinely used in telecommunications applications without the need for deliberately introduced reflection sites such a fibre Bragg grating or the like. The ability to use an unmodified length of standard optical fibre to provide sensing means that low cost readily available fibre may be used. However in some embodiments the optical fibre may comprise a fibre structure which has been fabricated to be especially sensitive to incident vibrations, or as will be described later, to be sensitive to varying magnetic fields. The optical fibre will typically be protected by containing it with a cable structure, possibly as part of a bundle of optical fibres.

In use the sensing fibre 301 is deployed in an area of interest to be monitored which, in the present invention is along the path of a power cable. The sensing fibre may be separate to the power cable and arranged to run generally along the length of the power cable. For instance a separate sensing fibre optic cable may be located to run alongside the power cable, for instance laid alongside the power cable, say within a few metres of the power cable, or attached to the outside of the power cable. In some embodiments the sensing fibre could form part of the power cable structure and may, for instance, comprise an optical fibre already present in a power cable, such as one of the one or more optical fibres 110 as illustrated in FIG. 1.

In operation the interrogator 302 launches coherent electromagnetic radiation into the sensing fibre, which will be referred to as interrogating radiation. The sensing fibre may, for instance, be repeatedly interrogated with pulses of optical radiation. In some embodiments a single pulse of optical radiation may be used for each interrogation, although in some embodiments multiple pulses may be used, in which case the optical pulses may have a frequency pattern as described in GB2,442,745 or optical characteristics such as described in WO2012/137022, the contents of which are hereby incorporated by reference thereto. Note that as used herein the term "optical" is not restricted to the visible spectrum and optical radiation includes infrared radiation and ultraviolet radiation. Any reference to "light" should also be construed accordingly.

The interrogator may therefore have at least one laser 305 and may comprise at least one optical modulator 306 for producing optical pulses. The interrogator also comprises at least one photodetector 307 arranged to detect radiation which is Rayleigh backscattered from the intrinsic scattering sites within the fibre 301. The signal from the photodetector may be processed by a processing module 308 of the interrogator unit to provide a measurement signal which is representative of disturbances acting on the fibre.

The phenomenon of Rayleigh backscattering results in some fraction of the interrogating optical radiation launched into the fibre being reflected back to the interrogator. As the interrogating radiation is coherent the Rayleigh backscatter received back at the interrogator at any instant is an interference signal of the backscatter generated within the sensing fibre from a particular position in the fibre. It will be noted this Rayleigh backscatter is generated by interaction between the interrogating radiation and inherent scattering sites present within the optical fibre. Thus the sensing function may be effectively distributed throughout the whole sensing fibre (although the returns are processed in time bins to provide results from individual sensing portions of the fibre). Such a sensor is therefore referred to as a distributed fibre optic sensor as the sensing is distributed throughout and intrinsic to the fibre itself. This is in contrast to sensors that used fibres having fibre Bragg gratings (FBGs) or similar deliberately introduced extrinsic reflection sites where the sensing function is provided in defined areas, typically as a point sensor.

The processing effectively divides the detected backscatter into a series of time bins based on the time after launch of the interrogating radiation. Each time bin may therefore corresponds to a different longitudinal sensing portion located at a different distance along the sensing fibre.

The backscatter radiation received at the detector for any given sensing portion of the optical fibre will depend on the distribution of the intrinsic sites within that portion of fibre, which is essential random. Thus the backscatter from one longitudinal sensing portion to the next will vary in a random fashion. However in the absence of an environmental stimulus acting on that section of the sensing fibre the backscatter signal received from one particular sensing portion will be the same from one interrogation to the next (assuming the characteristics of the interrogating radiation do not vary). However any disturbance on a given portion of the sensing fibre which results in a change of effective optical path of such sensing portion will alter the relative distribution of scattering sites and vary the interference signal from that section.

Thus the processing may analyse the backscatter from each of a plurality of sensing portions of the sensing fibre to detect variations in the backscatter between interrogations and use such variation as an indication of a disturbance acting on the fibre.

In some embodiments, especially those that use a single optical pulse per interrogation, the processing may look at the intensity of the backscatter from a given sensing portion. In some embodiments however, especially those that use two spatially separated pulses per interrogation, the processing may determine a phase value for the interference signal received at the photodetector from a given sensing portion (or a demodulated version of the interference signal). The processor module may therefore demodulate the returned signal, e.g. based on any frequency difference between the optical pulses. The interrogator may operate as described in GB2,442,745 or WO2012/137022 for example or as described in WO2012/137021. The processor module may also apply a phase unwrap algorithm.

It will therefore be clear that dynamic disturbances or changes acting on the fibre that result in a change of effective optical path length can therefore be detected in each of a plurality of sensing portions of the optical fibre.

Such changes may be dynamic strains due to mechanical disturbances on the optical fibre, for instance from incident pressure waves. The distributed fibre optic sensor may therefore be operable as a distributed acoustic sensor which generates measurement signals indicative of acoustic disturbances acting on sensing portions of the sensing fibre. Note that as used herein the term acoustic shall be taken to mean any type of pressure wave or varying strain generated on the optical fibre and for the avoidance of doubt the term acoustic will be used in the specification to include mechanical vibrations.

The form of the optical input and the method of detection thus allows a single continuous optical fibre to be spatially resolved into discrete longitudinal sensing portions. That is, the measurement signal sensed at one sensing portion can be provided substantially independently of the sensed signal at an adjacent portion. As mentioned such a sensor may be seen as a fully distributed or intrinsic sensor, as it uses the intrinsic scattering processed inherent in an optical fibre and thus distributes the sensing function throughout the whole of the optical fibre. The spatial resolution of the sensing portions of optical fibre may, for example, be approximately 10 m or so, which for a continuous length of fibre of the order of 10 km say could provide 1000 independent channels along the length of the optical fibre.

As the sensing optical fibre is relatively inexpensive the sensing fibre may be deployed in a location in a permanent fashion as the costs of leaving the fibre in situ are not significant.

As mentioned above in embodiments of the present invention the sensing fibre is deployed along the path of a power cable to be monitored and in particular may be deployed within the power cable, i.e. the sensing fibre 301 may be a suitable optical fibre running through a conduit 109 of the power cable illustrated in FIG. 1. A Rayleigh backscatter distributed fibre optic sensor interrogator unit 302 may be connected to one end of the sensing fibre, e.g. at power station 201 or power station 203, to monitor the cable in use to detect disturbances acting on the sensing fibre, in particular to perform distributed acoustic sensing. Thus up to 40 km or so of power cable could be monitored by a single interrogator which may be located on shore for example. For power cables of up to 80 km or length or so two interrogators could be arranged, one at each end of the power cable, i.e. one on the off-shore platform and one on shore. To avoid interference each interrogator could interrogate a separate sensing fibre within the power cable.

In some embodiments the sensing fibre may be one where at least one or more sections of the sensing fibre have been made sensitive to magnetic field variations such as described in WO2012/028846, the contents of which are incorporated by reference herein. This document describes that a sensing optical fibre may be coupled to a material, such as a magnetostrictive material, which reacts to an applied magnetic field in such a manner that a varying magnetic field produces a dynamic strain on the optical fibre. As described above a Rayleigh backscatter distributed fibre optic sensor will respond to dynamic strains. Thus such a sensor can be seen as a distributed fibre optic sensor for varying magnetic fields.

Figure 4:
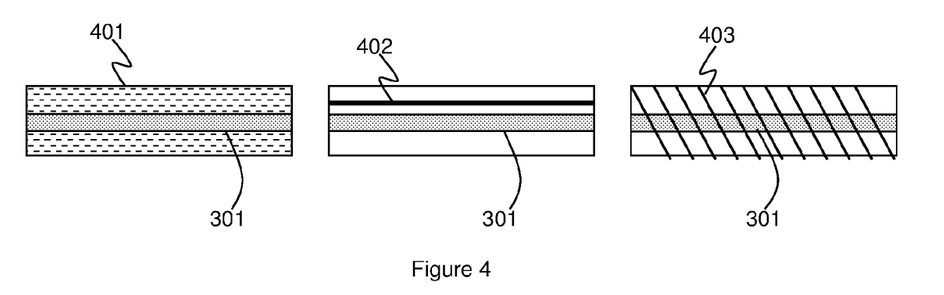
FIG. 4 illustrates various examples of sensing fibres for a distributed fibre optic sensor that is responsive to dynamic magnetic field variations.

The magnetostrictive material may be arranged so that its dimensions change anisotropically, so that flux in one dimension only may selectively be detected. Mechanical contact between the optical fibre and the magnetically responsive material may be achieved in various ways such as illustrated in FIG. 4. For instance a sensing optical fibre 301 may have a coating 401 which comprises magnetically responsive material, e.g. as particles in the form of powder or anisotropic particles in a binder material, which may for example be a polymer or adhesive. Additionally or alternatively the magnetically responsive material may comprise at least one wire 402 of magnetostrictive material disposed along at least part of optical fibre, e.g. co-extruded in a jacket material. In some embodiments the magnetically responsive material may comprise a material 403 braided around and coupled to the optic fibre. In any of these embodiments the magnetically responsive material may comprise a metal, such as nickel.

Such a sensing fibre will thus react to dynamic magnetic field variations acting on a sensing portion and the measurement signal will thus be a measurement signal of any changes in magnetic field.

If such a sensing cable were disposed within or coupled to an AC power cable then in use the magnetically responsive material would react to any varying magnetic fields produced by the power cable. As noted above for an undamaged power cable deployed to run in a generally straight path, the time varying magnetic fields produced by each conductor will typically tend to substantially cancel one another such that there is substantially no variation in magnetic field around the power cable in use. Thus if a magnetically sensitised optical fibre were deployed to run along the length of such a power cable then there would be expected to be no substantial signal arising from the cable in use.

However for a significantly distorted section of cable, as may the case if the cable is damaged, the magnetic fields from the various conductors may be imbalanced and thus there would be a time varying magnetic field produced in use at this point along the power cable. This magnetic field signature can be detected by using the magnetically sensitive distributed fibre optic sensor.

Figure 5:
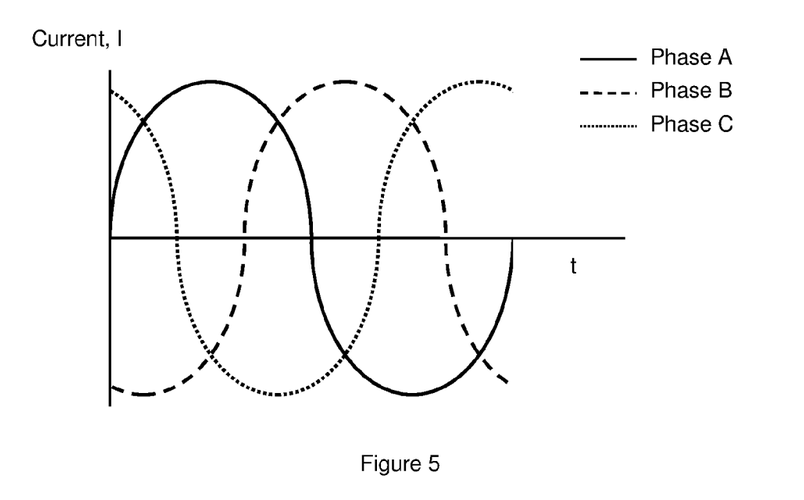
FIG. 5 illustrates the current prolife for conventional three phase AC.

The time varying magnetic field will vary based on the strength and direction of the current in the conductors. FIG. 5 illustrates the current profile for the three phases with a phase angle of 120° between each phase. The magnetic field will thus be a result of the superposition of the fields due to these varying currents, but in this case in an imbalanced way. This will generally produce a magnetic field variation with a component at a frequency of three times the frequency of the phase cycle.

For a magnetically sensitised fibre of the type described above however the magnetically induced strain does not depend on field direction but only on the field magnitude. Therefore the time varying magnetic field resulting from imbalanced magnetic fields may tend to induce a strain in the optical sensing fibre at six times the frequency of the power cycle (for three phase AC). Thus for example for three phase AC at a power frequency of 50 Hz, a deformation of the cable leading to imbalanced magnetic fields at a first location along the length of the power cable may be detected by a magnetically sensitised distributed fibre optic sensor by detecting a measurement signal from the relevant sensing portion at the first location that exhibits a significant signal component at substantially 300 Hz.

Even if the sensing fibre is not sensitised to be responsive to varying magnetic fields it will be appreciated that the result of deformation of the fibre, will mean that the magnetic fields are imbalanced and thus the magnetic field produced by one conductor may induced a force on another of the conductors. This will result in a strain being applied to the power cable that varies with the current. For power cables carrying significant currents, say up to 1000 A or so, the forces induced in use may be significant and thus at least some strain may be imparted to an optical fibre coupled to or embedded within the power cable. Thus using a distributed fibre optic sensor such as a conventional DAS sensor with an optical fibre running along the length of the cable may additionally or alternatively be used to detect a strain due to the imbalanced magnetic forces induced on the power cables conductors in use. This strain signal will depend with the direction of field and thus will tend to lead to a characteristic signal with a component at three times the power frequency of the AC cycle, e.g. about 150 Hz for a 50 Hz AC power cycle.

In one embodiment therefore a method of monitoring a power cable carrying multiple, e.g. three, offset AC phases involves using a distributed fibre optic sensor having a sensing optical fibre deployed to run along the length of the power cable to generate a measurement signal from each of plurality of longitudinal sensing portions of the optical fibre and analysing the measurement signals to detect a characteristic, i.e. a signature, indicative of imbalanced magnetic fields arising from the conductors of a power cable in use. The characteristic or signature may comprise a measurement signal from the distributed fibre optic sensor with a component related to the power frequency of the AC power cycle (and the number of AC phases).

In some embodiments the sensor may be a DAS sensor and the characteristic signature may be a signal with a component at a characteristic frequency of three times the power frequency (for three phase AC).

In some embodiments the sensing fibre may be sensitive to varying magnetic fields and the characteristic signature may be a signal with a component at a characteristic frequency of six times the power frequency (for three phase AC).

It will be appreciated that a magnetically sensitised sensing fibre may also be responsive to acoustic vibrations, i.e. to other dynamic strains in the sensing fibre. WO2012/028846 suggests that a second length of sensing fibre which is not magnetically sensitised may be deployed alongside the first magnetically sensitised sensing fibre to detect any acoustic disturbances. The signals detected by the second fibre can be subtracted from those detected by the first fibre to provide an indication of the varying magnetic field alone. Such an approach could also be adopted in embodiments of the present invention and the signals from the two sensing fibres would thus provide an indication of both acoustic and magnetic disturbances acting on a sensing portion. However as the signal of interest has a characteristic frequency it may be sufficient to look for signals in the frequency ranges of interest.

Detecting a signal with a significant component at the characteristic frequency in the measurement signal from a sensing portion of the optical fibre can be indicative that the power cable is significantly deformed at the location of the sensing portion. By detecting the presence of such a characteristic signature in the measurement signal from a sensing portion the existence of a fault can be detected. Further as distributed fibre optic sensing of this type inherently provides the location of the sensing portions along the length of the sensing fibre, and hence also along the power cable, the location of the fault is also determined.

It should be appreciated that in practice, even for an undamaged cable, the magnetic fields may not completely cancel and thus a signal with a component at the characteristic frequency may be detected by the distributed fibre optic sensor even for undamaged sections. This may be particularly the case if the power cable is deployed in a path that bends so that the current path of the conductors is not straight. Additionally the near field cancellation is not perfect and thus for embodiments where the sensing optical fibre is sensitised to magnetic fields and disposed to be close to the conductors, for instance, located within the power cable structure, there may be expected to be some component at the characteristic frequency.

However such signal components will be relatively low amplitude. The method may therefore involve detecting any characteristic signal components above a threshold level to detect a significantly deformed section of the power cable. The threshold level may be based, at least in part, by the signals components detected in use by the distributed fibre optic sensor. For example if the sensing optical fibre is deployed within the power cable and sensitised to magnetic fields it may be expected that all channels of the sensor may exhibit a certain signal component at the characteristic frequency. However the signal component will be expected to be much larger at a highly deformed section of the power cable compared to that for a section of power cable that is not deformed. Thus the general signal component from a plurality of sensing portions of the distributed fibre optic sensor may be used to set a baseline and any sensing portions with a signal component at the characteristic frequency that differs significantly from the baseline may be identified as being indicative of deformation of the power cable.

It will also be appreciated that in some instances the arrangement of the conductors in a power cable may not be designed to provide magnetic field cancellation. For instance three phase AC power cables with the conductors in a flat arrangement, i.e. the (centre of the) conductors all lie in substantially the same plane, are known, as are power cables with different numbers of phases. Embodiments of the present invention can still be applied to such power cables where the magnetic fields generated in use do not substantially cancel. The magnetic field generated by the power cable in use, i.e. the time varying field resulting from the combined fields of the individual conductors, will still vary with any deformation of the power cable. Thus again a baseline at the characteristic frequency could be established by looking at the relevant signal component in the measurement signals from a plurality of sensing portions of the distributed fibre optic sensor. Any significant variation from the baseline may be indicative of deformation of the power cable at the location of the relevant sensing portion. Additionally, as will be described in more detail below, it will be possibly to detect any significant variation over time in the signal component at the characteristic frequency from a given sensing portion as an indication of movement of the power cable.

For a power cable with n phases the characteristic frequency for a magnetically sensitised fibre will be 2n times the power frequency, whereas for strain detection using a DAS sensor the characteristic frequency will be n times the power frequency.

Figure 6:
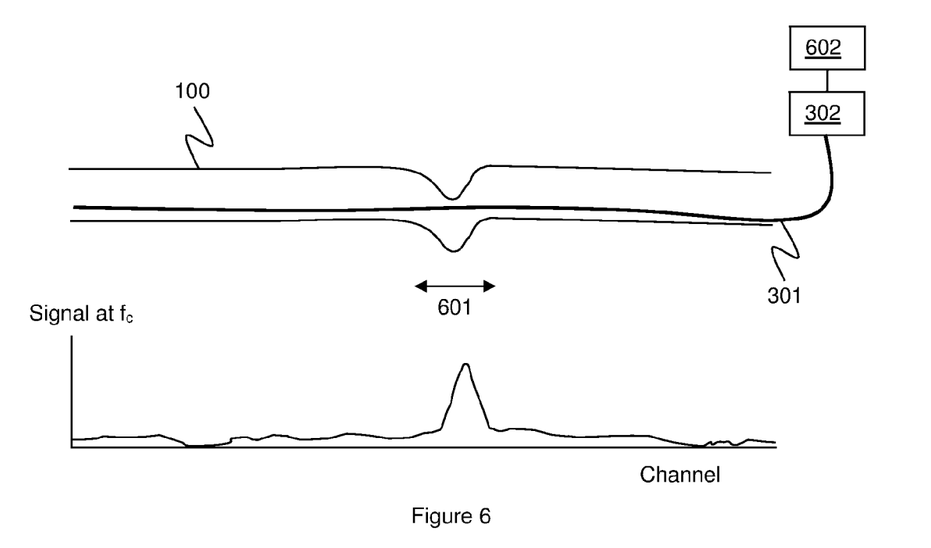
FIG. 6 illustrates an embodiment of the present invention.

FIG. 6 illustrates a length of power cable 100 such as illustrated in FIGS. 1 and 2 which is coupled to a sensing fibre 301, the sensing fibre being interrogated by interrogator unit 302. The sensing fibre may in some embodiments be magnetically sensitised such as illustrated in FIG. 4. The sensing fibre may be coupled to the power cable and may be instance be embedded within the power cable. The power cable is illustrated as running substantially straight but has a region of high deformation 601, i.e. a region of high bending. FIG. 6 also illustrates the detected signal components from the sensing channels along the length of the sensing fibre at the characteristic frequency $f_c$. It can be seen that any signal component at the characteristic frequency is at a low level apart from in the region 601. Detecting such a significant signal component at the characteristic frequency may indicate a defect in the power cable at this location. An analyser 602 may be arranged to process the measurement signals, for instance by band-pass filtering the signals at the characteristic frequency and comparing to a threshold level and/or monitoring the evolution of the signal components at this frequency over time.

The method may be applied following installation of a power cable, or following any period of down-time of the power cables, for instance following a period of maintenance or repair. The method may involve applying a test signal to the power cable, the test signal comprising a multiple, e.g. three, phase AC signal at an operating voltage which is lower than the nominal voltage for the power cable. In other words a relatively low voltage test signal may be applied initially, the test signal being sufficient to generate detectable magnetic field variation but being significantly lower than the full operating voltage of the power cable. If the applied voltage is relatively low then the presence of a fault may not result in catastrophic failure of the power cable but the magnetic field imbalance at a damaged section may be detectable.

If no significant magnetic field imbalance is detected the power cable may be energised to its nominal operating voltage. However if the characteristic signal indicating significant magnetic field imbalance is detected in response to the test voltage then the location of the affected area of the power cable may be determined and the power cable inspected.

Additionally or alternatively the method may comprise performing distributed fibre optic sensing in use to detect any changes in a characteristic signal.

As mentioned above, even for an undamaged power cable a deformation of the power cable that deviates the path of the cable from running straight, i.e. any significant bending of the power cable, may result in the magnetic fields becoming unbalanced and thus may result in the characteristic signature being observed in the measurement signals from the relevant section(s) of the sensing fibre. The method may thus comprise detecting any variation in a signal at the characteristic frequency or frequencies as indicating that the amount of bending of the power cable is varying in use. This indicates that power cable is free to move, i.e. unconstrained and may be free spanning. A relatively significant variation in the signals detected at the characteristic frequency could be indicative of significant variation in bending of the power cable, such as may be induced by vortex induced vibrations.

The variation in signal at the characteristic frequency may be analysed to determine some information or characteristic of the movement of the power cable. For instance the frequency of any variation in the signal the characteristic frequency, i.e. the 300 Hz or 150 Hz signal (for a 50 Hz power frequency), may indicate the frequency of any oscillation of the power cable. The change in amplitude of the signal at the characteristic frequency may indicate the extent of any bending. This may be useful to indicate the likely impact on the power cable.

It should be noted that in typical power cable installations the optical fibre itself may have a gel buffer. The gel, which helps protect the optical fibre, has the effect of effectively substantially decoupling the optical fibre from low frequency strains, e.g. strains below about 0.1 Hz for example. The strains on the optical fibre generated by cable movement such as VIV would typically be low frequency strains. Thus using a conventional DAS sensor it would not generally be possible to directly detect the movement of the power cable. However the effect of the movement on the magnetic field balance creates a magnetic induced strain. It is this secondary strain effect that generates a detectable signal, e.g. the 150 Hz signal for a three phase 50 Hz AC power cable.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

The invention claimed is:

1. A method of monitoring a power cable carrying multiple AC (alternating current) phases to detect deformation of the power cable, the method comprising:
   performing distributed fibre optic sensing on a sensing optical fibre to provide a measurement signal from each of a plurality of longitudinal sensing portions of the sensing optical fibre, the sensing optical fibre being coupled to the power cable; and
   analysing said measurements signals to detect a characteristic of an imbalance in magnetic fields wherein said characteristic of an imbalance in magnetic fields is a signal component at a characteristic frequency related to a power frequency of the AC phases.

2. A method as claimed in claim 1 wherein the measurement signal is a signal indicative of strains acting on the power cable and the characteristic frequency is n times the power frequency, where n is the number of AC phases.

3. A method as claimed in claim 1 wherein the sensing optical fibre comprises a magnetically sensitised optical fibre and wherein the measurement signal from each longitudinal sensing portion is indicative of the extent of any variations in magnetic field acting on that longitudinal sensing portion.

4. A method as claimed in claim 3, wherein said characteristic of an imbalance in magnetic fields is a signal component at a characteristic frequency related to a power frequency of the AC phases and wherein the characteristic frequency is 2n times the power frequency, where n is the number of AC phases.

5. A method as claimed in claim 3 wherein the sensing optical fibre comprises an optical fibre mechanically coupled to a magnetostrictive material.

6. A method as claimed in claim 1 wherein the method comprises detecting a signal component at the characteristic frequency above a threshold level.

7. A method as claimed as claimed in claim 1 wherein the method is performed when a test signal is applied to the power cable, the test signal being a multiple phase AC signal at a voltage lower than the nominal operating voltage for the power cable.

8. A method as claimed as claimed in claim 7 wherein the method comprises identifying the existence of the characteristic of an imbalance in magnetic fields in the measurement signal from a longitudinal sensing portion as a possible defect in the power cable and determining the location of the defect along the power cable from the location of the relevant sensing portion.

9. A method as claimed in claim 7 wherein the method is performed with the test signal prior to energising the power cable to its nominal operating voltage.

10. A method as claimed in claim 1 wherein the method is performed in operation of the power cable and the method comprises detecting whether the measurement signal from a sensing portion exhibits any variation in characteristic of an imbalance in magnetic fields.

11. A method as claimed in claim 10, wherein the method comprises detecting any variation in any signal component at the characteristic frequency.

12. A method as claimed in claim 10 wherein the method comprises identifying any variation in the characteristic of an imbalance in magnetic fields in the measurement signal from a sensing portion as an indication that the power cable is moving at the location of the relevant sensing portion.

13. A method as claimed in claim 12 wherein the method comprises analysing the variation in characteristic of an imbalance in magnetic fields to determine a characteristic of the movement of the power cable.

14. A method as claimed in claim 1 wherein the power cable is deployed, at least partly, as a submarine cable.

15. An apparatus for monitoring a power cable carrying multiple AC (alternating current) phases to detect deformation of the power cable, the apparatus comprising:

a distributed fibre optic interrogator unit for interrogating a sensing optical fibre coupled to the power cable to provide a measurement signal from each of a plurality of longitudinal sensing portions of the sensing optical fibre; and an analyser configured to analyse said measurements signals to detect a characteristic of an imbalance in magnetic fields wherein said characteristic of an imbalance in magnetic fields is a signal component at a characteristic frequency related to a power frequency of the AC phases.

16. An apparatus as claimed in claim 15 wherein the sensing optical fibre comprises a magnetically sensitised optical fibre and wherein the measurement signal from each longitudinal sensing portion is indicative of the extent of any variations in magnetic field acting on that longitudinal sensing portions.

17. An apparatus as claimed in claim 16 wherein the sensing optical fibre comprises an optical fibre mechanically coupled to a magnetostrictive material.

18. An apparatus as claimed in claim 15 wherein the analyser is configured to detect a signal component at the characteristic frequency above a threshold level.

* * * * *